(12) United States Patent
Pahn et al.

(10) Patent No.: US 10,217,898 B2
(45) Date of Patent: Feb. 26, 2019

(54) SEMICONDUCTOR DEVICE HAVING AN INTERNAL-FIELD-GUARDED ACTIVE REGION

(71) Applicant: Technische Universitat Berlin, Berlin (DE)

(72) Inventors: Gerald Pahn, Berlin (DE); Gordon Callsen, Berlin (DE); Axel Hoffmann, Berlin (DE)

(73) Assignee: TECHNISCHE UNIVERSITÄT BERLIN, Berlin (DE)

( * ) Notice: Subject to any disclaimer, the term of this patent is extended or adjusted under 35 U.S.C. 154(b) by 0 days.

(21) Appl. No.: 15/757,501

(22) PCT Filed: Sep. 9, 2016

(86) PCT No.: PCT/EP2016/071366
§ 371 (c)(1),
(2) Date: Mar. 5, 2018

(87) PCT Pub. No.: WO2017/042368
PCT Pub. Date: Mar. 16, 2017

(65) Prior Publication Data
US 2018/0261718 A1    Sep. 13, 2018

(30) Foreign Application Priority Data
Sep. 10, 2015    (DE) .......................... 10 2015 217 330

(51) Int. Cl.
*H01L 33/06*    (2010.01)
*H01L 31/0352*    (2006.01)
(Continued)

(52) U.S. Cl.
CPC .......... *H01L 33/06* (2013.01); *H01L 21/0243* (2013.01); *H01L 21/0254* (2013.01);
(Continued)

(58) Field of Classification Search
None
See application file for complete search history.

(56) References Cited

U.S. PATENT DOCUMENTS

| 2004/0135222 A1* | 7/2004 | Alfano | B82Y 10/00 |
|---|---|---|---|
| | | | 257/458 |
| 2007/0037308 A1 | 2/2007 | Okuyama et al. | |
| | (Continued) | | |

FOREIGN PATENT DOCUMENTS

| DE | 19953839 A1 | 5/2001 |
|---|---|---|
| WO | 2017/042368 A1 | 3/2017 |

OTHER PUBLICATIONS

Chuanyu Jia, et al; "Performance improvement of GaN-based LEDs with step stage InGaN/GaN strain relief layers in GaN-based blue LEDs"; Optics Express; vol. 21, No. 7; Apr. 8, 2013; pp. 8444-8449.
(Continued)

*Primary Examiner* — Asok K Sarkar
*Assistant Examiner* — Grant Withers
(74) *Attorney, Agent, or Firm* — Ware, Fressola, Maguire & Barber LLP

(57) ABSTRACT

A semiconductor device comprises a layer sequence formed by a plurality of polar single crystalline semiconductor material layers that each have a crystal axis pointing in a direction of crystalline polarity and a stacking direction of the layer sequence. A core layer sequence is formed by an active region made of an active layer stack or a plurality of repetitions of the active layer stack. The active layer stack has an active layer having a first material composition associated with a first band gap energy, and carrier-confinement layers embedding the active layer on at least two opposite sides thereof, having a second material composition associated with a second band gap energy larger than the first band gap energy. A pair of polarization guard layers is arranged adjacent to the active region and embedding the (Continued)

active region on opposite sides thereof. Both polarization guard layers have the first material composition.

16 Claims, 6 Drawing Sheets

(51) Int. Cl.
    *H01L 33/02* (2010.01)
    *H01L 33/16* (2010.01)
    *H01L 21/02* (2006.01)
    *H01L 33/00* (2010.01)
    *H01L 33/04* (2010.01)
    *B82Y 20/00* (2011.01)

(52) U.S. Cl.
    CPC .......... *H01L 21/02609* (2013.01); *H01L 31/035236* (2013.01); *H01L 33/007* (2013.01); *H01L 33/02* (2013.01); *H01L 33/16* (2013.01); *B82Y 20/00* (2013.01); *H01L 33/04* (2013.01)

(56) References Cited

U.S. PATENT DOCUMENTS

| | | | |
|---|---|---|---|
| 2009/0065762 A1 | 3/2009 | Lee et al. | |
| 2009/0236586 A1* | 9/2009 | Chen .......... | B82Y 20/00 257/15 |
| 2010/0252861 A1 | 10/2010 | Lochtefeld | |
| 2014/0103292 A1* | 4/2014 | Yoshida .......... | H01L 33/32 257/13 |

OTHER PUBLICATIONS

Chuanyu Jia, et al; "Performance improvement of GaN-based near-UV LEDs with InGaN/AlGaN superlattices strain relief layer and AlGaN barrier"; Superlattices and Microstructures Academic Press; vol. 97; Jul. 9, 2016; pp. 417-423.

Honig, et al; "Shielding Electrostatic Fields in Polar Semiconductor Nanostructures"; Physical Review Applied; vol. 7, No. 2; Feb. 6, 2017; pp. 024004-1-024004-9.

D.M. Van den Broeck, et al; "Strain-balanced InGaN/GaN multiple quantum wells"; Applied Physics Letters; AIP Publishing LLC, US; vol. 105, No. 3; Jul. 21, 2014; pp. 031107-1-031107-5.

Yu-Hsuan Lu, et al; "Efficiency Enhancement in Ultraviolet Light-Emitting Diodes by Manipulating Polarization Effect in Electron Blocking Layer"; Applied Physics Letters; vol. 102, No. 14; Apr. 8, 2013; pp. 143504-1 through 143504-4.

P. Waltereit, et al; "Nitride semiconductors free of electrostatic fields for efficient white light-emitting diodes"; 2000 Macmillan Magazines Ltd.; vol. 406; Aug. 24, 2000; pp. 865-868.

L. Nevou, et al; Intraband emission at 1.48 um from GaN/AlN quantum dots at room temperature; AIP Applied Physics Letters 92, 161105 (2008); pp. 161105-1 through 161105-3.

Shuji Nakamura, et al; "History of Gallium-Nitride-Based Light-Emitting Diodes for Illumination"; Proceedings of the IEEE; 2013; pp. 1-10.

Satoshi Kako, et al; "Single-photon emission from cubic GaN quantum dots"; AIP Applied Physics Letters 104; 2014; pp. 011101-1 through 011101-3.

G.M.O. Honig et al; "Shielding electrostatic fields in polar semiconductor nanostructures"; Institut fur Festkorperphysik, Technische Universitat Berlin; pp. 1-6 and supplementary information pp. 1-4.

Jeff Hecht; "Photonic Frontiers: Nitride VCSELS: Nitride VCSELs pose a tough challenge"; Laser Focus World; Oct. 7, 2014; pp. 1-7.

F. Guillot, et al; "Si-doped GaN/Al N quantum dot superlattices for optoelectronics at telecommunication wavelengths"; AIP Journal of Applied Physics 100; 2006; pp. 044326-1 through 044326-10.

N. Grandjean, et al; "Built-in electric-field effects in wurtzite AlGaN/GaN quantum wells"; AIP Journal of Applied Physics; vol. 86, No. 7; Oct. 1, 1999; pp. 3714-3720.

* cited by examiner

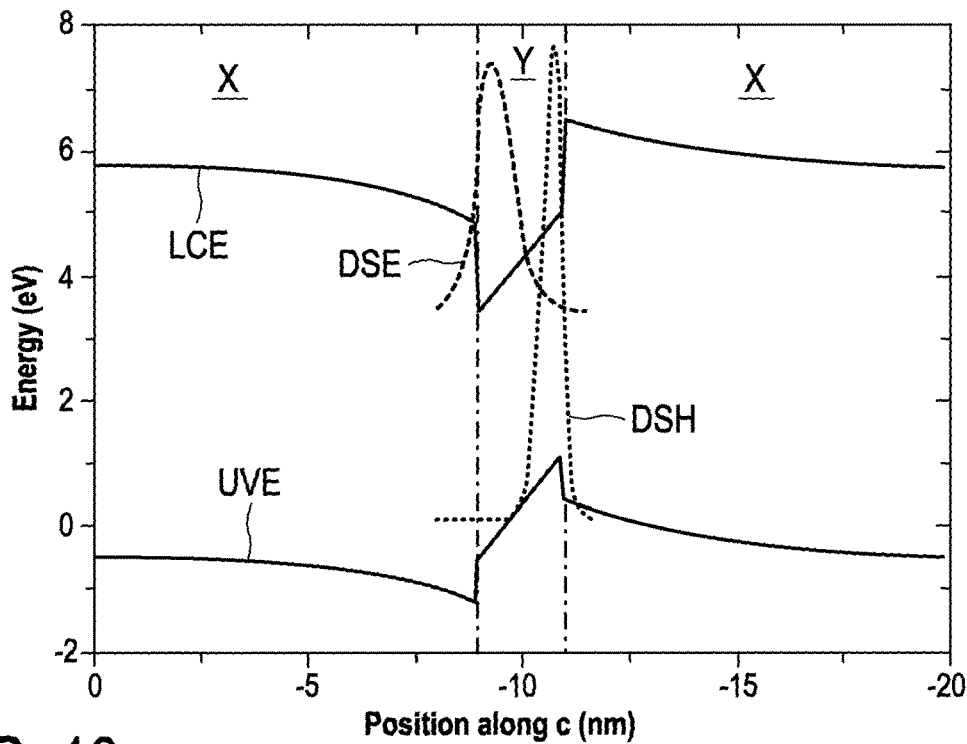
FIG. 10 -PRIOR ART-
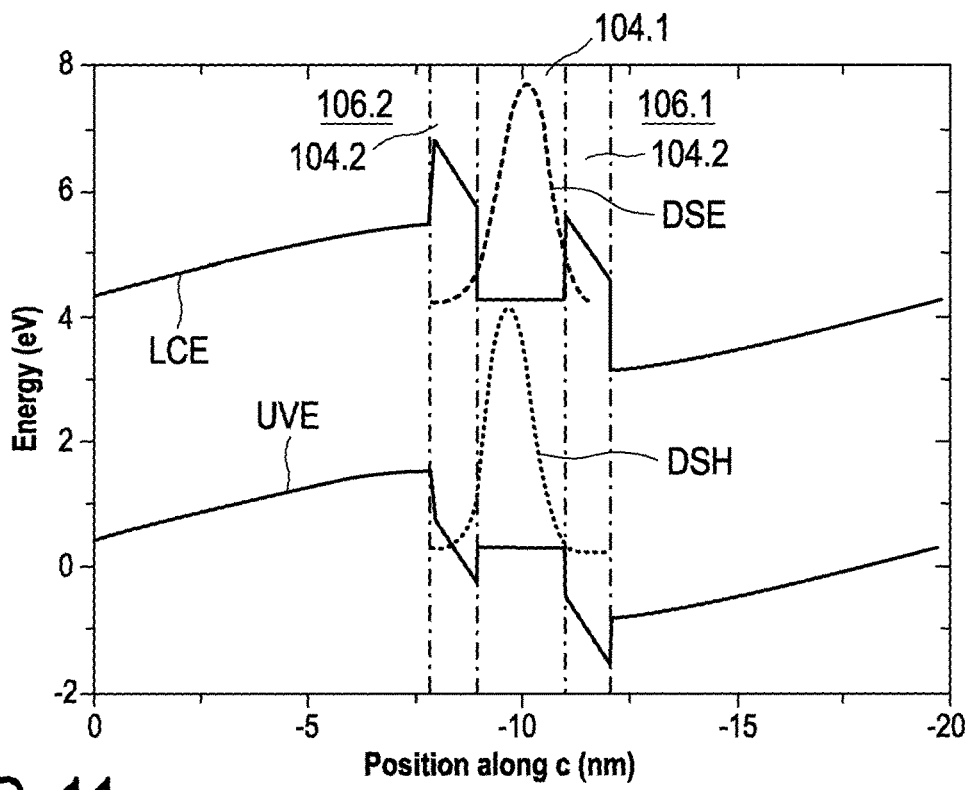
FIG. 11

SEMICONDUCTOR DEVICE HAVING AN INTERNAL-FIELD-GUARDED ACTIVE REGION

CROSS REFERENCE TO RELATED APPLICATIONS

This application is the U.S. National Stage of International Application Number PCT/EP2016/071366 filed on Sep. 9, 2016, which application claims priority under 35 USC § 119 to German Patent Application No. 102015217330.5 filed on Sep. 10, 2015. Both applications are hereby incorporated by reference in their entirety.

TECHNICAL FIELD

The present invention relates to a semiconductor device.

BACKGROUND OF THE INVENTION

Polarity in semiconductor materials arises from their crystal structure, and potentially from lattice distortion of the crystal lattice caused in particular by strained crystal lattices in semiconductor heterostructures.

Examples of polar semiconductors are compound semiconductors of hexagonal crystal structure, which have a polar axis along their c-direction and compound semiconductors of zincblende structure, which have a polar axis along their [111] direction. The following introduction will concentrate on hexagonal polar semiconductors as a non-limiting example.

Compound semiconductors of hexagonal crystal structure have constituent atoms arranged in a wurtzite structure. One non-limiting example of a group of polar semiconductor materials are compound semiconductors of hexagonal crystal structure such as group-III nitride semiconductors like GaN, AlN, AlGaN, InGaN, InAlN, or InGaAlN. They will also be referred to in short as group-III nitrides and as nitride semiconductors herein. Group-III atoms and nitrogen atoms are arranged in respective hexagonal sub-lattices. An extended unit cell of such materials is hexagonal and has a polar crystal axis parallel to the c-direction of the crystal lattice, which is called the c-axis. The c-axis points in a direction perpendicular to a (0001) plane of the hexagonal crystal lattice. The (0001) plane is called the C plane. Due to the hexagonal crystal structure, the C plane of group-III nitride semiconductor materials may terminate in one of two different configurations. A first configuration is called group-III-face (or Ga face, Al face, depending on the material) and has nitrogen (N) atoms bonded to three group-III atoms towards the surface. It is also referred to as the III-polar configuration. A second configuration which is known as N face and has a respective nitrogen atom bonded to a single group-III atom towards the surface. It is also referred to as the N-polar configuration. These two configurations should not be confused with modes of surface termination. Either configuration can be terminated on the surface with either group-III atoms or nitrogen atoms.

Hexagonal nitride semiconductor materials have a strong electrical polarization field along the c-axis. Such spontaneous polarization fields exist even in relaxed layers. A discontinuity of the electrical polarization at interfaces between layers of different material composition results in giant electric fields, which are known to have strong effects on the characteristics of device performance. Additional polarization is created in heteroepitaxial layers by a strained crystal lattice. In particular, the strong electric fields in the range of several MV/cm are responsible for substantial band bending effects, and for a spatial separation of wave functions of electrons and holes in quantum confinement structures such as quantum wells, quantum wires and quantum dots. A reduced overlap in the wave functions of electrons and holes is responsible for a reduced efficiency of light emission in semiconductor light emitter devices based on nitride semiconductors. Furthermore, the band bending and resulting spatial separation of electrons and holes result in a red shift of light emission in comparison with the so-called flat-band case, in which no electric fields are present.

DE 199 53 839 A1 is concerned with overcoming such disadvantages of a strong electrical polarization field that hexagonal nitride semiconductor materials have along the c-axis. The solution proposed by DE 199 53 839 A1 is to grow nitride semiconductor materials with a hexagonal crystal structure such that the c-axis of the hexagonal crystal structure is oriented parallel to a substrate surface. This concept requires use of an "exotic" substrate material that is not commonly used in semiconductor technology.

SUMMARY OF THE INVENTION

According to the present invention, a semiconductor device is provided. The semiconductor device comprises a layer sequence formed by a plurality of polar single crystalline semiconductor material layers that each have a crystal axis pointing in a direction that coincides with a direction of crystalline polarity and with a stacking direction of the layer sequence. The layer sequence is formed by a core layer sequence and shell layer sequences on opposite sides of the core layer sequence in the stacking direction. The core layer sequence is formed by an active region made of an active layer stack or plurality repetitions of the active layer stack, the active layer stack being formed by an active layer having a first material composition that is associated with a first band gap energy, and by carrier-confinement layers embedding the active layer on at least two opposite sides thereof and having a second material composition that is associated with a second band gap energy larger than the first band gap energy, wherein the active layer and the carrier-confinement layers are configured to effect a quantum-confinement of charge carriers in the active layer in one, two or three spatial dimensions; and a pair of polarization guard layers adjacent to the active region and embedding the active region on opposite sides thereof, both polarization guard layers having the first material composition.

The semiconductor device of the invention is made of a layer sequence of polar single crystalline semiconductor material layers that each have a crystal axis pointing in a direction that coincides with a direction of crystalline polarity and with a stacking direction of the layer sequence. In other words the crystal axis points in a direction that is perpendicular to that of the semiconductor material layers, in contrast to the solution proposed in DE 199 53 839. Still, the semiconductor device of the present invention allows achieving the advantage of a reduced or even fully shielded electric polarization field in the active layer in different embodiments of the semiconductor device. This is achieved by the proposed particular layer sequence, which includes dedicated polarization guard layers. The polarization guard layers achieve a partial or full shielding of electrical polarization fields in the active layer because they are made of the same material as the material of the active layer. In absence of the polarization guard layers, one component of such electrical polarization fields is generated by the discontinuity of the electrical polarization at interfaces between the polar semiconductor material layers of different material composition (also called spontaneous polarization), and another component is generated by a lattice strain that is induced by the semiconductor material layers of different material compositions (also called piezoelectric polarization). However, due to the particular design of the sequence of material compositions of the different layers forming the core layer sequence of the layer sequence, the active layer is shielded from such polarization fields. For this reason, the semiconductor device of the present invention is also referred to as an internal field guarded active region device (IFGARD).

Specifically, for achieving the partial or full shielding of the electrical polarization fields in the active layer, the layer sequence implements a particular symmetry at least in the core layer sequence, which can be described as a mirror symmetry in terms of the sequence of material compositions represented by the core layer sequence of the semiconductor device. In this core layer sequence having a mirror symmetry, the full active region of the semiconductor device corresponds to a mirror plane. The polarization guard layers embed the active region on two opposite sides of the active region and have the same material composition as that of the active layer in the active region. The polarization guard layers thus are the layers closest to the active region in the layer sequence. Thus, the symmetry described at least extends to the core layer sequence.

In comparison with the concept for avoiding electrical polarization fields in the stacking direction as known from DE 199 53 839 A1, the semiconductor device of the present invention requires a much smaller processing effort when applied to the growth of a semiconductor device made of nitride semiconductor materials. For it allows a natural growth mode, in which the stacking direction of the layer sequence is parallel to the c-axis. Furthermore, the semiconductor device of the present invention allows the fabrication of a much wider range of device structures. For instance, well-established techniques such as a self-organized growth of quantum-wire or quantum-dot structures of nitride semiconductor materials are available, while they cannot be applied under the growth concept of DE 199 53 839 A1 without generating undesired electrical polarization fields.

In the following, embodiments of the semiconductor device of the present invention will be described.

In some embodiments of the semiconductor device, a desired application function of the active region is based on a layer design of the layer sequence allowing an electrical current flow across at least parts of the shell layer sequence and across the core layer sequence under application of an operating voltage of suitable amount and polarity. In particular, the layer sequence of such embodiments, under application of an operating voltage, is configured to allow a current of charge carriers between the shell layer sequence and the core layer sequence, and a tunneling transport of the charge carriers between the polarization guard layers and the one or more repetitions of the active layer stack across those of the carrier-confinement layers that are adjacent to the polarization guard layers. The electrical current flow can for instance be used in different application contexts to drive an emission of electromagnetic radiation in the active region (LED, laser, non-classical light-emitters such as single photon emitter and/or entangled photon emitter), or to sense electromagnetic radiation in the active region (detector), or in the context of switching an electrical current (diode, transistor).

Other embodiments of the semiconductor device make use of other ways of generating charge carriers in the active region of the semiconductor device. An optical excitation of charge carriers or an electron beam excitation may for instance be employed. Such examples provide the freedom to select a higher thickness of the carrier-confinement layers that are adjacent to the polarization guard layers because a tunneling transport across these carrier-confinement layers is not required.

In optical or optoelectronic application cases, advantages of the semiconductor device of the present invention are related in particular to an achieved increase of spatial overlap between the wave functions of quantum-confined electrons and holes. The polarization guard layers achieve a reduction or full shielding of an otherwise observable polarization-induced gradient profile in the lower conduction band edge and in the upper valence band edge in the active layer. The achieved effect can be described as a "flat-band" situation across the active layer. In other words, the lower conduction band edge and the upper valence band edge have the same respective energy level across the active layer in the c-direction (the stacking direction). This results in an increase of a probability of optical transitions and therefore substantially increases the internal quantum efficiency of light emission or light absorption in comparison with semiconductor devices that do not make use of the polarization guard layers and the particular mirror symmetry in accordance with the present invention. It also results in a particularly sharp line shape of optical transitions, whether in light emission or light absorption. Optical transitions occurring in embodiments of the semiconductor device bridge substantially the same energy gap at any spatial position anywhere across the active layer. The polarization guard layers also achieve a reduced influence of active-layer thickness variations that can drastically shift the allowed energy levels of the quantum-confined charge carriers in the active layer.

In comparison with semiconductor light emitter devices using the same material compositions in the active layer stack, the semiconductor device embodiments of the present invention achieve optical transitions at a shorter wavelength. The shift in wavelength can be substantial and amount to a difference of light-emission energy of up to 0.7 eV.

Different alternative embodiments of the semiconductor device have respective different active regions. The active region is defined by the material compositions and the sequence of layers in the active layer stack and by the number of repetitions of the active layer stack. In other words, the active layer stack forms a unit sequence of layers of the active region that in some embodiments is provided only once, without any repetition. In other embodiments, the active layer stack is provided at least twice in the active region, in other words, with one repetition. By increasing the number of repetitions of the active layer stack in the active region, a desired functionality of the active region can be enhanced. In an application case of a semiconductor light emitting device, providing a plurality of repetitions of the active layer stack can increase the intensity of the emitted light. In a light detector device, a detection sensitivity can be increased by providing a plurality of repetitions of the active layer stack.

Where multiple active layer stacks are provided in the active region, the carrier-confinement layers (in short CCL) embedding the active layers (in short AL) is in some embodiments shared between neighboring ones of the active layer stacks. As an example, an active region having an active layer stack CCL-AL-CCL and two repetitions of the active layer stack, and which is encapsulated by the polarization guard layers (PGL) forms the following sequence: PGL-CCL-AL-CCL-AL-CCL-AL-CCL-PGL. In alternative embodiments, however, the layer sequence does not use such "shared" carrier confinement layers. Thus, an alternative example to the example of a sequence of the given above is PGL-CCL-AL-CCL-CCL-AL-CCL-CCL-AL-CCL-PGL. A sequence CCL-CCL of two adjacent carrier-confinement layers is realized by a thicker carrier-confinement layer, typically having a thickness of about twice that of a single carrier-confinement layer.

Preferably, the active region contains nothing but the active layer stack and zero, one or more repetitions of the layer stack. This is helpful for achieving a full shielding of the electrical polarization field in at least some of the active layers. It is even possible to achieve this flat band situation in a plurality of active layers when using repetitions of the active layer stack.

The particular design of the active layer stack depends on the desired application case. Design parameters that can be adapted with respect to a desired functionality are in particular a material composition and thickness of the active layer and of the carrier confinement layers. In an application case of a semiconductor device for optical or optoelectronic applications the material composition and thickness of the active layer and of the carrier-confinement layers are to be selected in accordance with a desired wavelength of emission or absorption.

Different alternative embodiments have an active layer stack, which achieves a one-dimensional, two-dimensional, or even three-dimensional confinement of the charge carriers in the active layer. In other words, the active layer stack implements either a quantum well structure, a quantum wire structure or a quantum dot structure in different embodiments.

A suitable maximum thickness of the active layer for optical or optoelectronic applications should be in the same order of magnitude as the Bohr radius of a free exciton in a bulk material having the first material composition, which is the material composition of the active layer. Some embodiments employing nitride semiconductor materials have an active layer with a thickness of two monolayers of an active-layer material with the first material composition in the active layer stack. Other embodiments have a thickness of the active layer in the range between 3 and 15 monolayers of the active-layer material, as exemplified a thickness of 1 nanometer in one embodiment. Preferably, a thickness of the active layer is less than 25 nanometer, in particular not more than 5 nanometer.

The carrier-confinement layers typically have a thickness in the range between 0.5 and 100 nanometer. The second material composition and a thickness of the carrier-confinement layers are in some embodiments selected to allow a tunneling transport of the charge carriers between the polarization guard layers and the carrier-confinement layers under application of an operating voltage. Such embodiments typically have carrier-confinement layers with a thickness in the range between 0.5 and 5 nanometer. Where technically feasible, the thickness of the carrier-confinement layers can be as small as one monolayer of the semiconductor material of the second material composition.

A thickness of the polarization guard layers is preferably at least one monolayer of a guard layer material having the first material composition. A selection of the thickness of the polarization guard layers in the design phase of the semiconductor device can be based on the goal of a desired fine-tuning of the energy of optical transitions by inducing, in a manner controllable by the layer design, a band bending within the active layer of the active layer stack. An upper limit of the thickness of the polarization guard layers does not exist in the sense that the polarization shielding effect could be reduced or even lost beyond a certain thickness of the polarization guard layers. This is not the case. The polarization guard layers on different sides of the active region can even have different thicknesses. Therefore, the thickness can be determined based on application requirements of a particular device design. In some examples, the thickness of the polarization guard layers is not more than 1 micrometer. In other embodiments, the thickness is at most 100 nanometer. Further embodiments have polarization guard layers with a thickness that is 50 nanometer or less.

In some embodiments, a thickness of the polarization guard layer on at least one of the opposite sides of the active region is either smaller or at most equal to a thickness of the active layer. In optical device applications, since the active layer is typically thin, this group of embodiments achieves a particularly low internal absorption of photons that are either generated or to be absorbed in the active region. In those embodiments that have a smaller thickness of the at least one polarization guard layer in comparison with the active layer, this advantageous effect can be made particularly strong. This can be attributed to a blue shift of allowed optical transitions in the polarization guard layer compared to those in the active layer. Since the polarization guard layer is of the same material composition as the active layer, a smaller thickness of the polarization guard layer in comparison with the active layer increases the energy gap between the states involved in optical transitions in the polarization guard layer beyond that in the active layer. Thus, a degree of light transmission of the polarization guard layer for photons generated in the active layer can be even further increased in comparison with a polarization guard layer of a thickness equal to that of the active layer.

In variants falling under this group of embodiments, only one outer face of the semiconductor device is used as an interface with an ambient environment for light emission or light detection. This outer face may for instance be called an "upper face", without intending to limit an orientation of the semiconductor device in space for application cases in any way. The particular polarization guard layer that is used for transmitting light that passes through this outer face of the semiconductor device may thus for simplicity be called the "upper polarization guard layer". In some of these variants, only this upper polarization guard layer has a thickness that is smaller than or equal to the thickness of the active layer, while the opposite polarization guard layer has a thickness that is larger than that of the active layer. This forms an example of a semiconductor device with polarization guard layers of different thicknesses.

Embodiments of the semiconductor device for optical or optoelectronic applications form a light emitting diode, a laser, or a non-classical light emitter such as a single photon emitter or an entangled-photon emitter. In such embodiments, the layer sequence typically forms a diode, and the active region comprises a layer stack configured to emit light under application of an operating voltage to the layer sequence, which operating voltage is suitable for allowing an electric current across the diode. In embodiments forming a light detector, the layer sequence forms a diode, and the active region comprises a layer stack configured to generate an electrical current under application of an operating voltage to the layer sequence, which operating voltage is suitable for blocking an electric current across the diode in absence of absorption of light of a predetermined minimum photon energy, which can be determined by suitable material and layer design, in the active region. p-doped and n-doped regions of the semiconductor device can be designed in a manner known per se. Doping in amounts relevant for technological applications has only a very small effect on band bending, which is sufficient for allowing operation, but can be neglected with respect to effects of polarization described hereinabove.

In some embodiments, the layer sequence is configured as a photonic crystal comprising an array of holes extending through the layer sequence between the end faces.

Further embodiments employ one or more further polarization guard layers in the shell region, which are herein referred to as shell polarization guard layers for the purpose of distinction from the polarization guard layers provided in the core region of the semiconductor device.

In some variants of such embodiments, the shell layer sequences each comprise a respective outer layer, each outer layer forming one of two opposite end faces of the layer sequence, which end faces interface with a dielectric, such as an ambient gas or a dielectric material layer, or with a contact material of metallic electrical conductivity. Each of the outer layers has the first material composition, i.e., the material composition of the active layer(s) in the core region. For instance, the shell layer sequence of some embodiments comprises a first outer layer forming a top cover layer having a thickness of at least 25 nanometer and having the first material composition. The shell layer sequence of other embodiments comprises a second outer layer that forms a bottom carrier layer of the layer sequence, having a thickness of at least 25 nanometer and having the first material composition. Preferred embodiments have both the top cover layer and the bottom carrier layer, each being made of the first material composition that is identical to that of the active layer.

In other embodiments, at least one of the shell layer sequences comprises one or more intermediate layers made of a material not having the first material composition. In such layer designs, the one or more intermediate layers are embedded between two shell polarization guard layers having the first material composition. In other words, the two shell polarization guard layers are arranged adjacent to, i.e., directly neighboring the intermediate layer. In variants, which use a sequence of different intermediate layers, the shell polarization guard layers embed the sequence of intermediate layers. In other words, they are arranged adjacent to opposite end layers of the sequence of intermediate layers. One example of an intermediate layer is a very thin layer of insulating material, such as silicon nitride, which is typically used to achieve a reduction of defect density, and thin enough to allow a current flow across the intermediate layer. Another example is an intermediate layer or layer sequence of semiconductor material used for defect reduction. Such an intermediate layer structure may for instance be formed of a layer stack of a gradient or stepwise changing material composition, or by a superlattice. Undesired polarization effects on the active region due to the insertion of the intermediate layer or the sequence of intermediate layers in one of the shell layer sequences or in both of the shell layer sequences are shielded by the shell polarization guard layers, which are made of the first material composition, thus exactly the material of the active layer.

In preferred embodiments, the layer sequence is made of group-III nitride semiconductor materials. In some of these embodiments, the first and second material compositions form different stoichiometries of $In_zAl_yGa_xN$ semiconductor materials, wherein $0 \leq x, y, z \leq 1$ and $x+y+z=1$, or $Al_yGa_xN$ semiconductor materials, wherein $0 \leq x, y \leq 1$ and $x+y=1$. In one embodiment, the first material composition is GaN, and the second material composition is AlN. In this embodiment, the outer region is preferably also made of GaN.

In another embodiment, the polar semiconductor materials of the first and second and third compositions are hexagonal II-VI semiconductor materials, for instance having different stoichiometries from the material group $Zn_xMg_yO$, wherein $0 \leq x, y \leq 1$ and $x+y=1$.

Further embodiments are made of II-VI semiconductor materials of cubic symmetry, with the stacking direction being parallel to the [111] direction, for instance having different stoichiometries from the material group of ZnCdSSeTe.

Additional embodiments are recited in the attached claims.

BRIEF DESCRIPTION OF THE DRAWINGS

Further embodiments will be described in the following with respect to the attached figures. In the figures:

FIG. 10 is a band-structure profile along a stacking direction of a layer sequence of a semiconductor device according to the prior art, as determined by 8-band kp-based band structure calculation;

FIG. 11 is a band-structure profile along a stacking direction of a layer sequence of an embodiment of a semiconductor device according to an embodiment of the present invention, as determined by 8-band kp-based band structure calculation;

DETAILED DESCRIPTION

Figure 1:
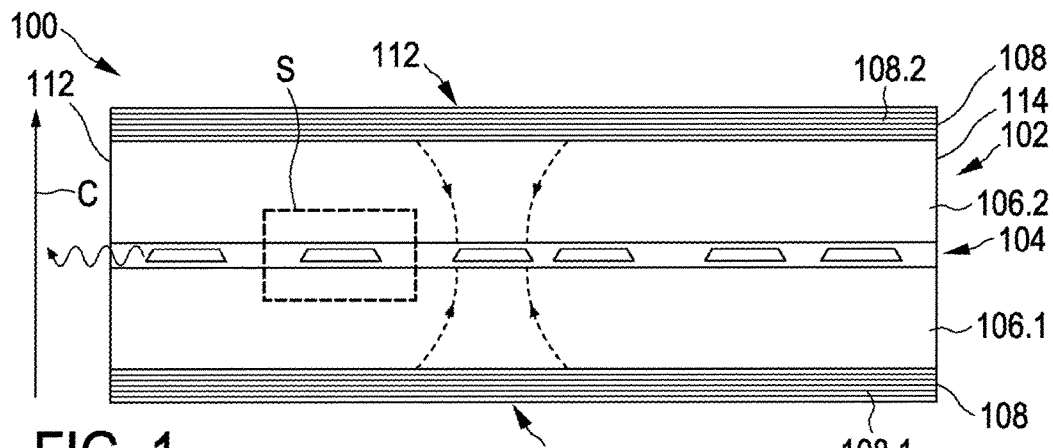
FIG. 1 is a schematic cross-sectional view of an embodiment of a quantum-dot semiconductor device forming a light emitter.
Figure 2:
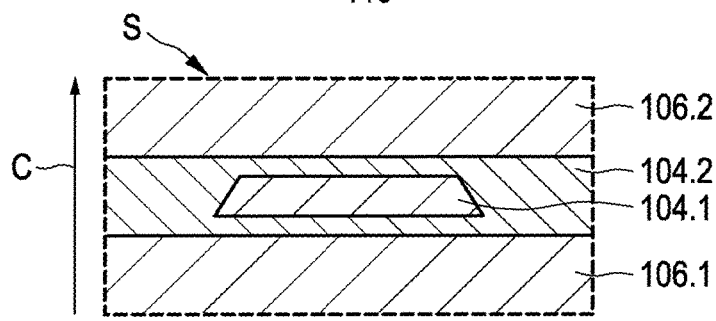
FIG. 2 is an enlarged view of a section of the quantum-dot semiconductor device of FIG. 1.

FIG. 1 is a schematic cross-sectional view of an embodiment of a quantum-dot semiconductor device 100 forming a light emitter. Reference is made in parallel to FIG. 2, which shows an enlarged view of a section S outlined by a dashed line in FIG. 1.

The quantum dot semiconductor device 100 comprises a layer sequence 102 formed by a number of polar semiconductor material layers, which will be described in the following. The semiconductor material layers are group-III nitride semiconductors and each have a hexagonal crystal structure. The layer sequence 102 consists of semiconductor material layers that each have a crystal axis pointing in a direction c indicated by a vertical arrow in FIG. 1. The c direction also forms the stacking direction of the layer sequence 102. Typically, the layer sequence 102 is fabricated by epitaxial growth, the growth direction of the layer sequence 102 thus being the c direction.

Specifically, the layer sequence 102 consists of the following layers: an active region 104, which is formed of an active layer stack that consists of an active layer 104.1, and carrier-confinement layers 104.2 embedding the active layer 104.1. In the present case, the active layer 104.1 is made of quantum dots made of gallium nitride GaN, which thus forms the first semiconductor material. In the present embodiment, the quantum dots 104.1 are fully embedded by the carrier-confinement layers 104.2, which are made of aluminum nitride AlN. In a variant of the present embodiment, which is not shown in the figures, the active layer additionally comprises a wetting layer of one or two monolayers of gallium nitride. The quantum dots of the active layer can be fabricated in a self-organized manner in an epitaxial growth process using a Stranski-Krastanov growth mode on an AlN growth surface. A small extension of the quantum dots 104.1 in the three spatial dimensions creates a three-dimensional confinement of charge carriers, as is per se well-known in the art. The active layer stack 104 is embedded by a pair of polarization guard layers 106.1 and 106.2. These polarization guard layers are made of the same material as the quantum dots, i.e., they are made of gallium nitride in the present example. The active region 104 and the polarization guard layers 106.1 and 106.2 together form a core region of the semiconductor device 100.

A shell region 108 of the semiconductor device 100 is made of shell layer sequences 108.1 and 108.2. The shell layer sequences may each comprise one or more layers. In the present embodiment, a lower shell layer sequence is formed by a substrate layer 108.1 and an upper shell layer sequence is formed by a cover layer 108.2. The substrate layer 108.1 and the cover layer 108.2 are made of the same material. In the present example, these two layers forming the outer region of the layer sequence 102 are made of gallium nitride, which is also the material of the active layer 104.1. The substrate layer 108.1 and the cover layer 108.2 form outer layers and hence constitute the opposite end faces 110 and 112 of the layer sequence. The end faces form an interface of the layer sequence with a contact material of an electrical contact structure, which is not shown in FIG. 1.

In a variant of the present embodiment (not shown), there is an intermediate layer sequence between the bottom layer 108.1 and the polarization guard layer 106.1. The intermediate layer sequence is formed by a buffer layer sequence comprising AlGaN layers of alternating material compositions, such as a superlattice or as a layer sequence of stepwise or gradient composition changes (not shown in FIG. 1). Such intermediate layer sequences serve for achieving a particularly low defect density in the active region 104. In this variant, the intermediate layer sequence is embedded between two shell polarization guard layers made of GaN (the material of the active layer) on each side, wherein the GaN substrate layer 108.1 thus forms one of the two shell polarization guard layers, and the other of the two shell polarization guard layers is not shown in FIG. 1. The shell polarization guard layers are arranged adjacent to the intermediate layer sequence on both sides of it. This way, the active region 104 is shielded from polarization fields due to the polar hetero-interfaces in the intermediate layer sequence, which thus cannot influence the band profile in the active region 104 along the stacking direction.

In operation of the semiconductor device 100, an operation voltage is applied across the layer sequence, which creates a current across the layer sequence in vertical direction, which is the direction c or a direction pointing opposite to that direction c. Due to the presence of the polarization guard layers 106.1 and 106.2, a tunneling transport of charge carriers is achieved, and carriers are localized in the quantum dots 104.1, where light is generated through an optical interband or intraband transition occurring after capture of charge carriers injection into the active layer 104.1 via a tunneling process across a tunnel barrier formed by the carrier-confinement layer 104.2. Further details of the effects of the particular layer sequence will be described further below with reference to FIGS. 10 and 11.

An optical interband transition involves in some embodiments an emission of one photon corresponding at least approximately to the band gap energy. In other embodiments, a two-photon emission process is used, involving an emission of two photons of lower energy to bridge the band gap energy. In an optical intraband transition, a transition between different states within the same energy band involves the emission of a photon of infrared energy. Intraband light emitters, for instance from an active region made of nitride semiconductor materials, can be used in communication technology because the emission energies are in a range suitable for optical transmission media, such as glass fibers.

The structure of the semiconductor device of FIGS. 1 and 2 overcomes challenges faced by prior-art solutions and linked via the Quantum-Confined Stark Effect (QCSE). Specifically, in layer sequences without polarization guard layers, the QCSE spatially separates an electron wave function from a hole wave function in the active layer, due to strong built-in electric fields originating from the (spontaneous) pyro- and piezoelectricity of the polar semiconductor materials. The residual electron-hole overlap does not only limit the luminescence intensity, but also introduces large excitonic dipole moments in the QDs' growth direction. Hence, these excitonic dipole moments cause a large coupling to external, e.g. defect-induced, electric fields evoking spectral diffusion that originates highly undesirable emission line broadening in such prior-art devices. In addition, large effective hole masses in GaN in combination with the specific shape of GaN QDs resembling an upright, truncated, hexagonal pyramid, originate the existence of hybrid-biexciton states. While a standard, c-plane GaN QD of common size (e.g., height in c direction 2 nm, width 10 nm) provides a strong three-dimensional confinement for the electron situated at the top of the QD, the hole is most frequently only weakly confined in lateral directions. In this sense, common GaN QDs only achieve a full 3D-confinement of an exciton through the fully confined electron, which localizes the accompanying hole via the Coulomb interaction. As a direct consequence, a subtle balance of interactions in e.g. a biexcitonic complex is heavily altered to such an extend that a lateral separation of the hole wave functions occurs and enables parallel hole spin orientations. Hence, the total "spin projection" t (orbital angular momentum+spin) of a biexciton does not amount to zero anymore, but can reach up to $t=\pm 3$. Consequently, a biexcitonic decay in most GaN QDs evolves via the long-lived dark exciton states ($t=\pm 2$), enabling a large variety of non-radiative decay processes before the final decay of the bright excitons ($t=\pm 1$) occurs subsequent to a phonon-mediated spin-flip process.

In contrast, the inclusion of GaN guard layers 106.1 and 106.2 enhances the overall luminescence output as a shielding of the polarization fields can be obtained precisely at the position of the active layer 104.1. The key idea of this concept comprises the depicted guard layers 106.1 and 106.2 that consist of exactly the same material as the active layer 104.1. As a result of this particular layer sequence, the band structure reaches a highly desirable flat-band condition. Naturally, as a draw-back the polarization guard layers will absorb a certain fraction of the overall emission in growth direction, while in-plane light propagation as required for light-guiding purposes and resonators is not directly limited.

Figure 3:
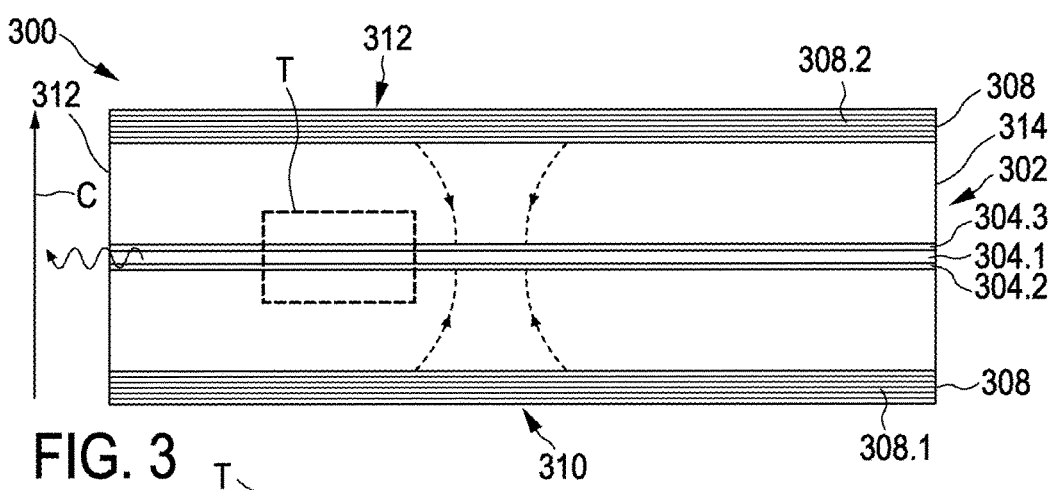
FIG. 3 is a schematic cross-sectional view of an embodiment of a quantum-well semiconductor device.
Figure 4:
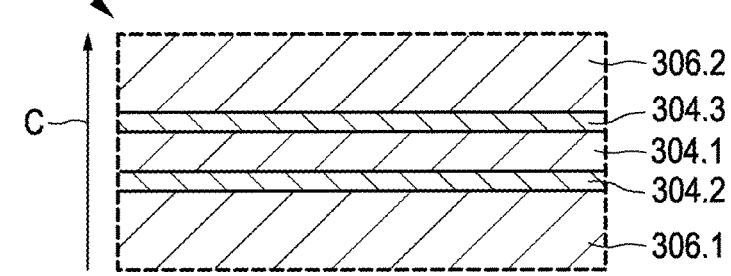
FIG. 4 is an enlarged view of a section of the quantum-well semiconductor device of FIG. 3.

Next, reference will be made to FIGS. 3 and 4 and parallel. FIG. 3 is a schematic cross sectional view of an embodiment of a quantum-well semiconductor device. FIG. 4 is an enlarged view of a section of the quantum well semiconductor device of FIG. 3. The semiconductor device 300 of FIG. 3 resembles the semiconductor device 100 of FIG. 1 in many aspects. For this reason, reference labels are used for the structural elements of the semiconductor device 300, which differ from those of corresponding structural elements the embodiment of FIGS. 1 and 2 only in their first digit, which is "3" instead of "1". The following description will first turn to those features of the semiconductor device 300 distinguishing it from the semiconductor device 100.

In particular, as can also be seen in the enlarged view of FIG. 4, the semiconductor device 300 comprises an active layer stack 304, which comprises a quantum well formed by an active layer 304.1 and carrier confinement layers 304.2 embedding the active layer 304.1 in the stacking direction c. Otherwise, the layer sequence is identical in comparison with that of the semiconductor device 100. In the active region 304 of the semiconductor device 300, the quantum well formed by the active layer 304.1 and the carrier confinement layers 304.2 and 304.3 achieves a confinement of charge carriers or excitons in one dimension, and thus allows motion of the charge carriers or excitons in the remaining two spatial dimensions.

As for the embodiment of FIGS. 1 and 2, the active layer stack 304 is embedded by a pair of polarization guard layers 306.1 and 306.2. The polarization guard layers are made of the same material as the active layer 304.1, which is the quantum well layer. In the present example, they are made of gallium nitride GaN. A shell region 308 of the semiconductor device 300 is made of a substrate layer 308.1 and of a cover layer 308.2. The substrate layer 308.1 and the cover layer 308.2 are made of the same material as the active layer 304.1. In the present example, these two layers forming the outer region of the layer sequence 302 are thus made of GaN. The two outer layers 308.1 and 308.2 form opposite end faces 310 and 312 of the layer sequence. The end faces form an interface of the layer sequence with a contact material of an electrical contact structure, which is not shown in FIG. 3.

Both semiconductor devices 100 and 300 can be used as edge light emitters using emission from the edges 112, 114 and 312, 314, respectively. However, by choosing a suitable thickness of the layers of the shell layer sequence 308.1, or 308.2, surface emission can be used without having to accept a strong loss of intensity of light emission.

Figure 5:
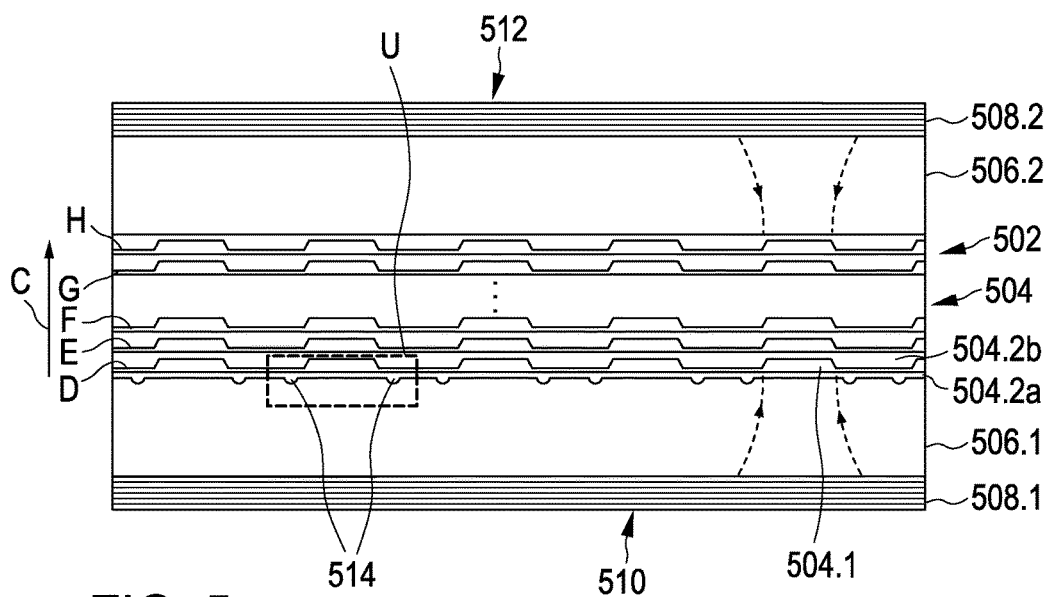
FIG. 5 is a schematic cross-sectional view of another embodiment of a quantum-dot semiconductor device.
Figure 6:
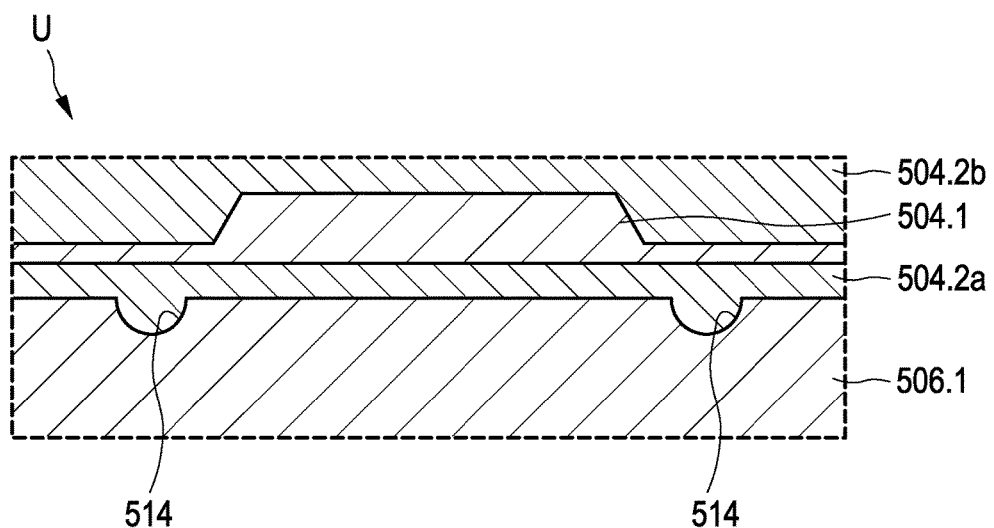
FIG. 6 is a schematic cross-sectional view of a section of another embodiment of a semiconductor device.
Figure 7:
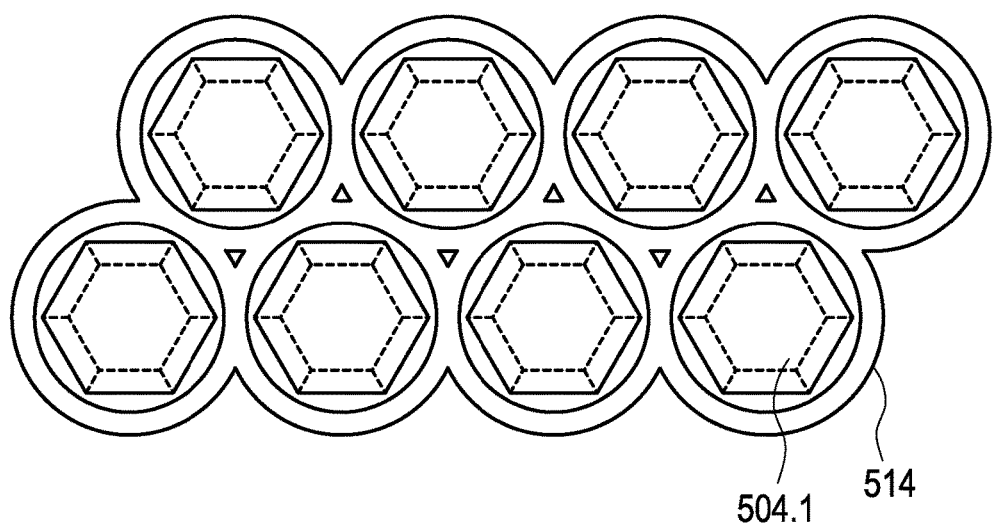
FIG. 7 is a schematic top view of the semiconductor device of FIG. 6.

Next, reference will be made to FIGS. 5 to 7 in parallel. FIG. 5 is a schematic cross sectional view of another embodiment of a quantum dot semiconductor device. FIG. 6 is an enlarged view of a section of the quantum dot semiconductor device of FIG. 5. FIG. 7 is a schematic view of a section of a lowermost active layer in the active region of the semiconductor device of FIG. 5, as seen from above when neglecting any layer grown on top of the subject active layer.

The semiconductor device 500 of FIGS. 5 and 6 resembles the semiconductor devices 100 of FIGS. 1 and 2 and 300 of FIGS. 3 and 4 in many aspects. For this reason, reference labels are used for the structural elements of the semiconductor device 500, which differ from those of corresponding structural elements of the embodiments of FIGS. 1 to 4 only in the first digit, which is "5" instead of "1" or "3". The following description will first turn to those features of the semiconductor device 500, which distinguish it from the semiconductor devices 100 and 300.

In the present example, the quantum dots 504.1 extend from an initial wetting layer of at most one mono layer thickness, which is typical for a Stranski-Krastanov growth mechanism. In order to facilitate the positioning of single quantum dots 504.1 by a self-assembled quantum dot growth based on the Stranski-Krastanov growth mechanism on the thin AlN carrier-confinement layer 504.2a, a positioning technique via a strain aperture is employed. A strain aperture is formed by an AlN micro-ring 514 fabricated in a surface region of the adjacent GaN polarization guard layer 506.1 by standard etching techniques. The GaN material inside the AlN ring 514 is laterally strained and for that reason forms an energetically favorable strain aperture for quantum-dot growth on the carrier-confinement layer. This micro-ring technique is scalable, allowing the positioning of more than one quantum dot 504.1 within one and the same micro-ring 514.

Furthermore, the active region 504 contains a plurality of active layer stacks, each formed by two carrier confinement layers 504.2a, 504.2b embedding a quantum dot layer forming the active layer 504.1. In the sequence of active layer stacks within the active region 504, an upper carrier-confinement layer 504.2b of a given active layer stack at the same time forms a lower carrier-confinement layer 504.2a of a respective next active layer stack in the stacking direction c. The number of repetitions of the active layer stack within the active region 504 can be selected according to the requirements of a given application case. In the example of FIG. 5, five active layer stacks with active layers labeled D, E, F, G, and H are shown in the active region, wherein the region between the active layers F and G includes additional repetitions of the active layer stack, which are not shown, but indicated by three dots in vertical sequence. As shown in FIG. 7, the micro rings can be fabricated and positioned in a regular array.

Figure 8:
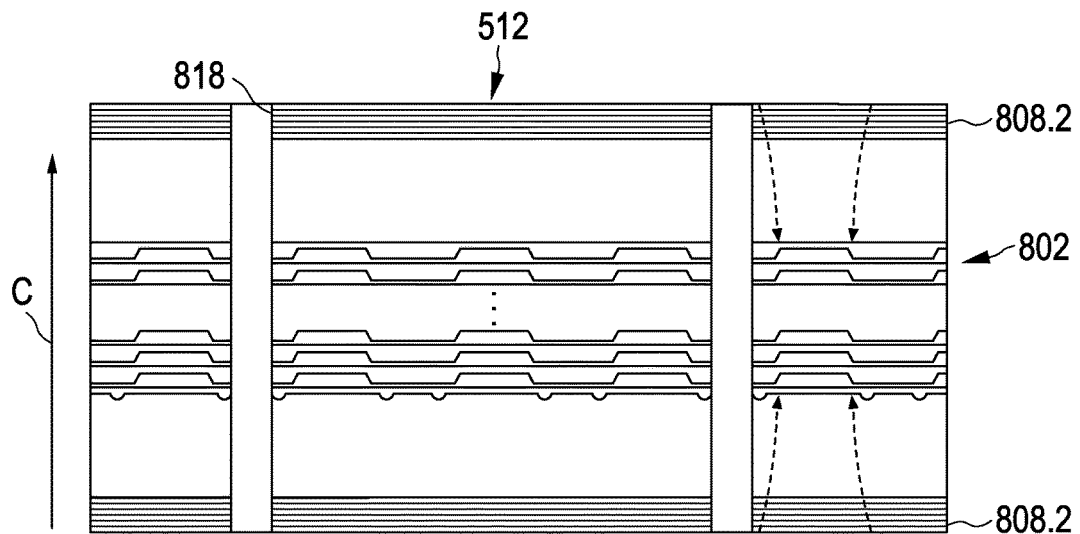
FIG. 8 is a schematic cross-sectional view of another embodiment of a quantum dot semiconductor device forming a photonic crystal.
Figure 9:
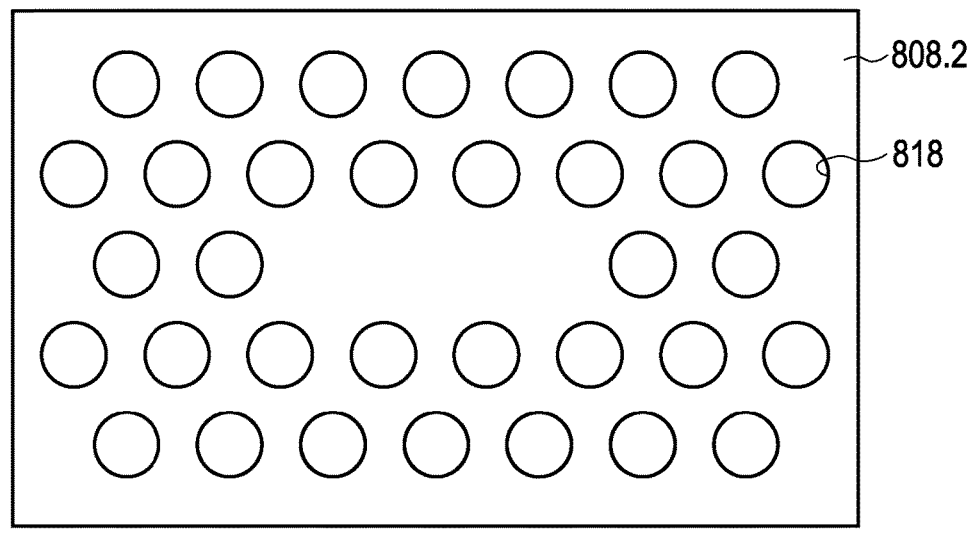
FIG. 9 is a schematic top view of the embodiment of FIG. 8.

Next, reference will be made to FIGS. 8 and 9 in parallel. FIG. 8 is a schematic cross-sectional view of another embodiment of a quantum dot semiconductor device forming a photonic crystal. FIG. 9 is a schematic top view of the embodiment of FIG. 8. The embodiment of the semiconductor device 800 shown in FIG. 8 is based on the layer sequence of the semiconductor device 500 of FIGS. 5 to 7. In addition, the semiconductor device 800 has a regular array of holes 818 fabricated to extend through in the layer sequence between its end faces 810 and 812, i.e., from the bottom of the carrier layer 808.1 to the top of the cover layer 808.2. This way a photonic crystal is realized. The photonic crystal can be formed by that layer sequence as a thin freestanding membrane.

Next, reference will be made in parallel to FIGS. 10 and 11. FIG. 10 is a band-structure profile along a stacking direction of a layer sequence of a semiconductor device according to the prior art, as determined by 8-band kp-based band structure calculation. FIG. 11 is a band-structure profile along a stacking direction of a layer sequence of an embodiment of a semiconductor device according to an embodiment of the present invention, as determined by 8-band kp-based band structure calculation.

The band profile shown in FIG. 11 corresponds to the device structures shown in FIGS. 1 and 2.

On the abscissa, a position along the c direction in units of nanometers is given. The origin of the abscissa corresponds to a position at the upper end face 112 of the layer sequence 102 shown in FIG. 1. On the ordinate, an energy level is indicated in units of electron volts. The band structure profiles of FIGS. 10 and 11 show the energy levels of a lower conduction band edge LCE and of an upper valance band edge UVE as a function of the position along the direction c in the different layers of the respective layer sequence. Reference labels of corresponding layers in the embodiment of FIGS. 1 and 2 are indicated in the upper part of the diagram of FIG. 11, and interfaces between the different layers are indicated by dash-dotted vertical lines.

As described earlier, the layer sequence shown in FIG. 1 comprises polarization guard layers 106.1 and 106.2 made of gallium nitride, carrier confinement layers 104.2 made of aluminum nitride and embedding the active layer 104.1 made of gallium nitride. In order to assess the effect of the polarization guard layers 106.1 and 106.2 on the band profile along the c direction, a comparative calculation was made for a layer sequence, which omits the polarization guard layers 106.1 and 106.2 and only comprises an active layer Y of gallium nitride embedded between carrier confinement layers X of aluminum nitride. The total geometrical extension of the layer sequences in the c direction was assumed to be the same for both layer sequences of FIGS. 10 and 11.

It is noted that the position range in c direction shown in FIGS. 10 and 11 forms a section of a full layer structure, the shown range being chosen to be able to resolve band structure changes on a 0.1 nanometer scale. At the positions of 0 and 20 nanometer, bulk values of the respective material parameters of GaN were used in the simulation to illustrate the effect achieved in a real device structure of larger extension in c direction.

A comparison of the band profiles shown in FIGS. 10 and 11 shows that the introduction of the polarization guard layers and the thickness of their carrier confinement layers in the layer structure of FIG. 11 achieves a flat band situation in the active layer 104.1. In contrast, the reference structure shown in FIG. 10 exhibits a strong gradient of the band edge energies along the c direction in the active layer, which is due to strong built-in electric fields originating from the pyro- and piezoelectricity of the polar semiconductor materials. The residual electron-hole overlap does not only limit the luminescence intensity, but also introduces large excitonic dipole moments in the growth direction of the active layer Y. As indicated in FIGS. 10 and 11 by dotted lines, density of states calculations for electrons (DSE) and holes (DSH) reveal spatially separated state densities in the reference structure underlying the band structure calculations of FIG. 10, while a strong spatial overlap of the state densities is achieved in the embodiment of the present invention according to FIG. 11. This is particularly advantageous for applications in the fields of optics and optoelectronics.

For the purpose of the present band structure calculations along the c direction a quantum dot-based layer sequence was assumed. Similar results are achieved when the active layer is formed by a quantum wire or a quantum well.

Figure 12:
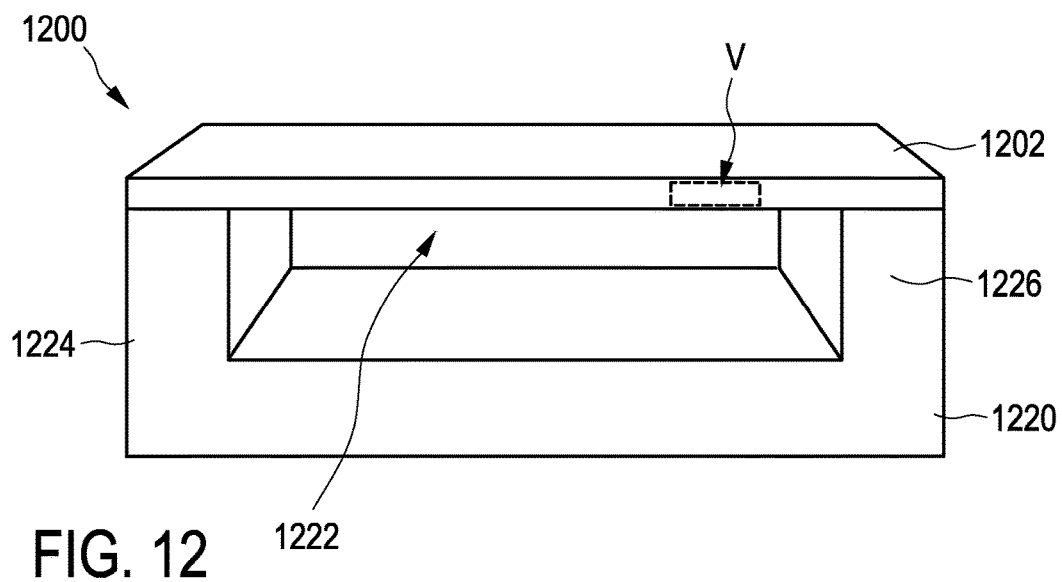
FIG. 12 is a schematic three-dimensional view of a further embodiment of a semiconductor device according to the present invention.
Figure 13:
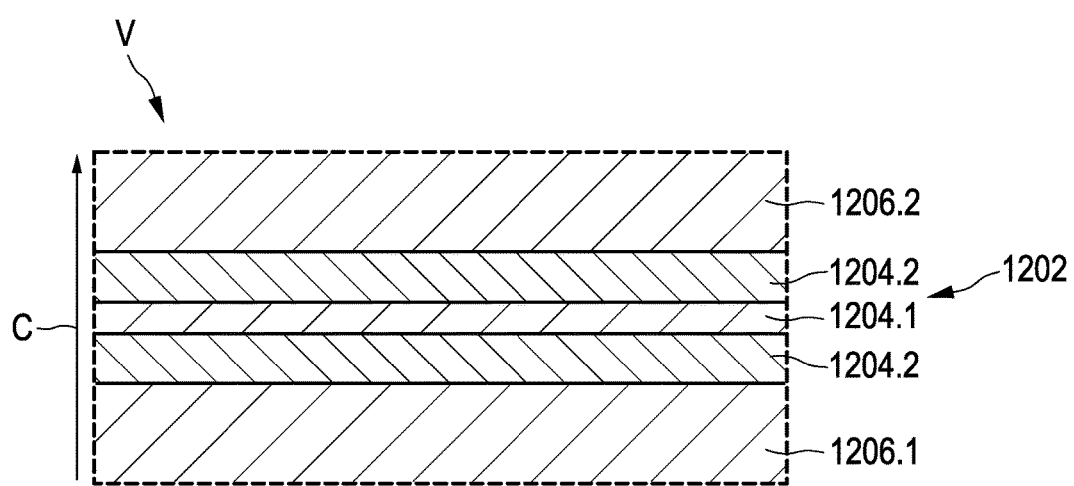
FIG. 13 is a schematic cross-sectional view of a layer sequence of the semiconductor device of FIG. 12.

Next, reference is made to FIGS. 12 and 13 in parallel. FIG. 12 is a schematic three-dimensional view of a further embodiment of a semiconductor device 1200 according to the present invention. FIG. 13 is a schematic cross-sectional view of a layer sequence 1202 of the semiconductor device 1200 of FIG. 12.

FIG. 12 illustrates a layer sequence 1202 that forms a nitride nano-membrane structure that is deposited on a silicon (111) carrier 1220. The nitride nano-membrane structure consisting of the layer sequence 1202 bridges a gap region 1222 between bridge posts 1224 and 1226 on the carrier, the carrier layer of the layer sequence being exposed to an ambient atmosphere in the gap region 1222 between the bridge posts 1224 and 1226. The particular layer sequence inside of the nitride nano-membrane is detailed in FIG. 13 and comprises GaN guard 1206.1 and 1206.2 adjacent to AlN carrier confinement layers 1204.2, which enhances the overall luminescence output from an active layer 1204.1 made of GaN. The depicted polarization guard layers 1206.1 and 1206.2 thus consist of exactly the same material as the active layer 1204.1. As a result of this particular layer sequence, the commonly strongly inclined band structure of nitride devices that are affected by the QCSE reaches a highly desirable flat-band condition as shown in FIG. 11 above.

It is noted that the graphical illustrations of FIGS. 1 through 9, 11 and 12 are schematic, in particular with respect to layer thicknesses shown, and for instance also with respect to a number of quantum dots that form the active layer in the embodiment of FIGS. 1 and 2 and others. No indication of actual extensions of structural elements is intended to be given by way of the graphical illustrations.

In summary, a semiconductor device comprises a layer sequence formed by a plurality of polar single crystalline semiconductor material layers that each have a crystal axis pointing in a direction of crystalline polarity and a stacking direction of the layer sequence. A core layer sequence is formed by an active region made of an active layer stack or a plurality of repetitions of the active layer stack. The active layer stack has an active layer having a first material composition associated with a first band gap energy, and carrier-confinement layers embedding the active layer on at least two opposite sides thereof, having a second material composition associated with a second band gap energy larger than the first band gap energy. A pair of polarization guard layers is arranged adjacent to the active region and embedding the active region on opposite sides thereof. Both polarization guard layers have the first material composition. The pair of polarization guard layers shields the active layer(s) from internal polarization fields.

The invention claimed is:

1. A semiconductor device, comprising a layer sequence formed by a plurality of polar single crystalline semiconductor material layers that each have a crystal axis pointing in a direction that coincides with a direction of crystalline polarity and with a stacking direction of the layer sequence; wherein the layer sequence is formed by a core layer sequence and shell layer sequences on opposite sides of the core layer sequence in the stacking direction; and wherein the core layer sequence is formed by an active region made of an active layer stack or a plurality of repetitions of the active layer stack, the active layer stack being formed by an active layer having a first material composition that is associated with a first band gap energy, and by carrier-confinement layers embedding the active layer on at least two opposite sides thereof and having a second material composition that is associated with a second band gap energy larger than the first band gap energy, wherein the active layer and the carrier-confinement layers are configured to effect a quantum-confinement of charge carriers in the active layer in one, two or three spatial dimensions; and a pair of polarization guard layers adjacent to the active region and embedding the active region on opposite sides thereof, both polarization guard layers having the first material composition.

2. The semiconductor device of claim 1, wherein the second material composition and a thickness of the carrier-confinement layers are selected to allow a tunneling transport of the charge carriers between the polarization guard layers and the carrier-confinement layers under application of the operating voltage.

3. The semiconductor device of claim 1, wherein the active layer has a thickness of at least two monolayers.

4. The semiconductor device of claim 1, wherein the active layer has a thickness of less than 25 nanometer.

5. The semiconductor device of claim 1, wherein a thickness of the polarization guard layers is at least one monolayer.

6. The semiconductor device of claim 1, wherein a thickness of the polarization guard layers is suitable for fully shielding an electrical polarization field in the active layer.

7. The semiconductor device of claim 1, wherein a thickness of the polarization guard layer on at least one of the opposite sides of the active region is either smaller or at most equal to a thickness of the active layer.

8. The semiconductor device of claim 1, wherein the shell layer sequences each comprise a respective outer layer, each outer layer forming one of two opposite end faces of the layer sequence, which end faces interface with a dielectric or a contact material of metallic electrical conductivity, and wherein each of the outer layers has the first material composition.

9. The semiconductor device of claim 8, wherein the shell layer sequence comprises a first outer layer forming a top cover layer or second outer layer forming a bottom carrier layer of the layer sequence, the first or second outer layer having a thickness of at least 20 nanometer and having the first material composition.

10. The semiconductor device of claim 9, wherein the layer sequence bridges a gap region between bridge posts arranged on a carrier, the carrier layer of the layer sequence being exposed to an ambient atmosphere in the gap region between the bridge posts.

11. The semiconductor device of claim 1, wherein at least one of the shell layer sequences comprises one or more intermediate layers made of a material not having the first material composition, wherein the one or more intermediate layers are embedded between two shell polarization guard layers having the first material composition.

12. The semiconductor device of claim 11, wherein the layer sequence bridges a gap region between bridge posts arranged on a carrier, the carrier layer of the layer sequence being exposed to an ambient atmosphere in the gap region between the bridge posts.

13. The semiconductor device of claim 1, wherein the layer sequence forms a sequence of epitaxial layers deposited on a carrier layer.

14. The semiconductor device of claim 1, wherein the first material composition is GaN and the second material composition is AlN.

15. The semiconductor device of claim 1, wherein the layer sequence forms a diode and the active region comprises a layer stack configured to emit light under application of an operating voltage to the layer sequence, which operating voltage is suitable for allowing an electric current across the diode.

16. The semiconductor device of claim 15, wherein the layer sequence is configured as a photonic crystal comprising an array of holes extending through the layer sequence between the end faces.

* * * * *